(12) United States Patent
Huang et al.

(10) Patent No.: US 11,587,807 B2
(45) Date of Patent: Feb. 21, 2023

(54) ANNEALING APPARATUS AND METHOD THEREOF

(71) Applicant: TAIWAN SEMICONDUCTOR MANUFACTURING CO., LTD., Hsinchu (TW)

(72) Inventors: Yung-Chang Huang, Taichung (TW); Yu-Chi Tsai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 977 days.

(21) Appl. No.: 16/297,058

(22) Filed: Mar. 8, 2019

(65) Prior Publication Data

US 2020/0135518 A1 Apr. 30, 2020

Related U.S. Application Data

(60) Provisional application No. 62/751,702, filed on Oct. 28, 2018.

(51) Int. Cl.
*H01L 21/67* (2006.01)
*B25J 9/16* (2006.01)
(Continued)

(52) U.S. Cl.
CPC ...... *H01L 21/67259* (2013.01); *B25J 9/1674* (2013.01); *B25J 11/0095* (2013.01); *H01L 21/324* (2013.01); *H01L 21/67103* (2013.01); *H01L 21/68707* (2013.01); *G05B 2219/45031* (2013.01)

(58) Field of Classification Search
CPC ............ B25J 9/1674; B25J 11/0095; G05B 2219/45031
See application file for complete search history.

(56) References Cited

U.S. PATENT DOCUMENTS 6,140,256 A * 10/2000 Ushikawa ........... C23C 16/4586
438/795
6,245,192 B1 * 6/2001 Dhindsa ............ C23C 16/45565
438/731
(Continued)

FOREIGN PATENT DOCUMENTS

CN 101072984 A 11/2007
CN 105598976 A 5/2016
(Continued)

OTHER PUBLICATIONS

Yixiong Chen et al., "Brief tutorial on new technologies for mobile devices," Chongqing University Press, pp. 33-34 (Aug. 31, 2016).

*Primary Examiner* — Stephen A Vu
(74) *Attorney, Agent, or Firm* — Maschoff Brennan

(57) ABSTRACT

An annealing apparatus includes a heater plate and a cooler plate disposed in a chamber, a delivering robot, a sensor and circuitry. The delivering robot is configured to deliver a wafer between the heater plate and the cooler plate in the chamber. The sensor is located on the delivering robot and configured to output a first signal in response to a motion of the delivering robot. The circuitry is coupled to the sensor and configured to detect whether an abnormality of the delivering robot occurs according to the first signal.

20 Claims, 6 Drawing Sheets

(51) Int. Cl.
    *H01L 21/324*     (2006.01)
    *B25J 11/00*     (2006.01)
    *H01L 21/687*     (2006.01)

(56) References Cited

U.S. PATENT DOCUMENTS

| | | | |
|---|---|---|---|
| 6,289,735 | B1 | 9/2001 | Dister et al. |
| 6,364,949 | B1 * | 4/2002 | Or ................... C23C 16/4412 118/724 |
| 7,114,693 | B1 * | 10/2006 | Olgado ............ H01L 21/68707 248/637 |
| 7,156,924 | B2 * | 1/2007 | Renken ............ H01L 21/67109 118/724 |
| 2006/0037499 | A1 | 2/2006 | Park et al. |
| 2007/0111519 | A1 | 5/2007 | Lubomirsky et al. |
| 2012/0046904 | A1 | 2/2012 | Hayashi et al. |
| 2012/0251789 | A1 * | 10/2012 | Tanaka ................ B32B 41/00 156/64 |
| 2014/0273293 | A1 | 9/2014 | Liu et al. |

FOREIGN PATENT DOCUMENTS

| | | | |
|---|---|---|---|
| CN | 105651376 A | 6/2016 | |
| TW | 559584 A | 11/2003 | |
| TW | 200607052 A | 2/2006 | |
| TW | 200716794 A | 5/2007 | |
| TW | M447821 U | 3/2013 | |
| TW | 201616597 A | 5/2016 | |
| WO | WO-2018003372 A1 * | 1/2018 | ......... C23C 16/0209 |

* cited by examiner

ANNEALING APPARATUS AND METHOD THEREOF

This application claims priority to U.S. Provisional Application Ser. No. 62/751,702, filed Oct. 28, 2018, which is herein incorporated by reference.

BACKGROUND

In a semiconductor manufacturing process, one or more metal layers are formed within microelectronics fabrications. Thermal treatments are often applied to modify electrical properties of the one or more metal layers.

For example, a thermal annealing process is often applied to the metal layer. In annealing, atoms migrate in the crystal lattice and the number of dislocations decreases, leading to a change in ductility, hardness, or other electrical properties of the metal layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
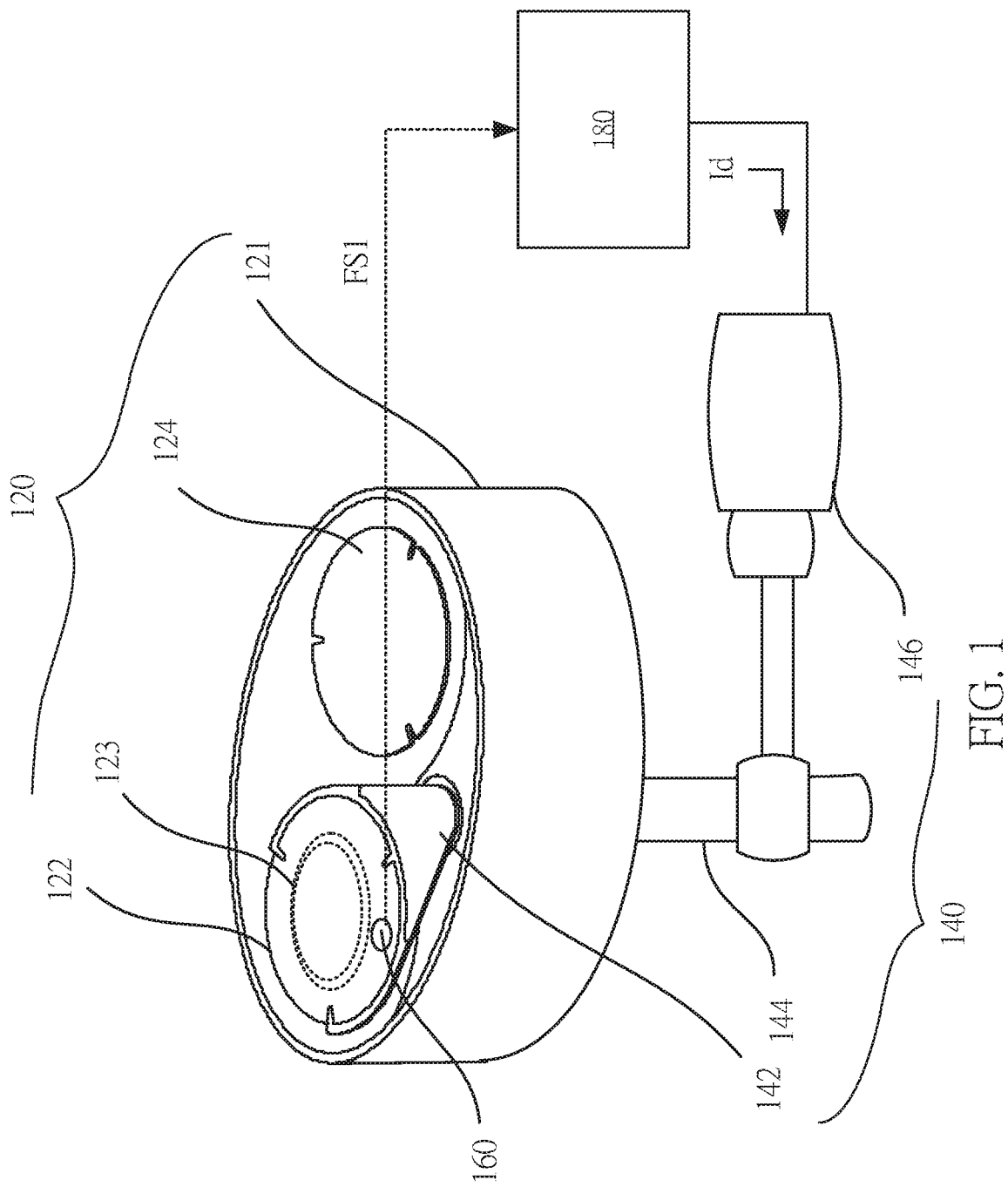
FIG. 1 is a diagram illustrating an annealing apparatus in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference is made to FIG. 1. FIG. 1 is a diagram illustrating an annealing apparatus 100 in accordance with some embodiments of the present disclosure. As shown in FIG. 1, the annealing apparatus 100 includes a chamber 120, a delivering robot 140, a sensor 160 and a processing circuit 180.

In some embodiments, the chamber 120 is a Rapid Thermal Anneal (RTA) chamber. During an annealing process, a wafer including a substrate with a metal layer thereon is annealed in the chamber 120. For example, in some embodiments, the metal layer is formed by an electrochemical plating (ECP) process in an ECP cell, such as processing cell.

The chamber 120 includes an enclosure 121, a heater plate 122, a heater 123, and a cooler plate 124. The enclosure 121 includes a base, a sidewall and a top. The wafer 200 is transferred into and out of the chamber 120 through an opening on the sidewall. In some embodiments, a slit valve is disposed on the sidewall and selectively seals the opening on sidewall of the enclosure 121 that communicates with a loading station. A loading station transfer robot transfers the wafer 200 into and out of the chamber 120 through the opening.

As shown in FIG. 1, the heater plate 122 and the cooler plate 124 are disposed in the chamber 120. After the loading station transfer robot transfers the wafer 200 into the chamber 120 through the opening, the delivering robot 140 is configured to deliver the wafer 200 between the heater plate 122 and the cooler plate 124 in the chamber 120.

As shown in FIG. 1, the delivering robot 140 includes a fork 142, a rotate cylinder 144 and a motor 146. In structural, the rotate cylinder 144 is coupled to the fork 142, and the motor 146 is coupled to the rotate cylinder 144. The fork 142 is arranged in the chamber 120 and configured to load the wafer. Specifically, the loading surface of the fork 142 is configured to carry the wafer. The rotate cylinder 144 is configured to rotate the fork 142 between the heater plate 122 and the cooler plate 124. Specifically, the motor 146 is configured to control the rotate cylinder 144 to rotate in response to a driving current Id in order to shift the fork 142 between the heater plate 122 and the cooler plate 124 in the chamber 120.

The sensor 160 is located on the delivering robot 140 and configured to output a first signal FS1 in response to a motion of the delivering robot 140. As shown in FIG. 1, in some embodiments, the sensor 160 is located on the loading surface of the fork 142. Accordingly, the sensor 160 is contacted to the wafer 200 when the wafer 200 is loaded. In some other embodiments, the sensor 160 is located on a support arm of the fork 142, and accordingly, the sensor 160 is configured to output the first signal FS1 without contacting to the wafer 200 when the wafer 200 is loaded. In some other embodiments, the fork 142 as a whole is used as the sensor 160. The variation of the arrangements for the sensor 160 will be discussed in the following paragraphs in accordance with the accompanying drawings later. In some embodiments, the sensor 160 is implemented by a Micro Electro Mechanical System (MEMS) sensor, such as a gravity sensor (i.e., g-sensor), which is also known as an accelerometer configured to measure proper acceleration (i.e., g-force) and detect and monitor vibration in rotating machinery. In some embodiments, the shift information, velocity information, and/or acceleration information are detected by the sensor 160 and transferred to the processing circuit 180 in order to perform further analysis.

Figure 2:
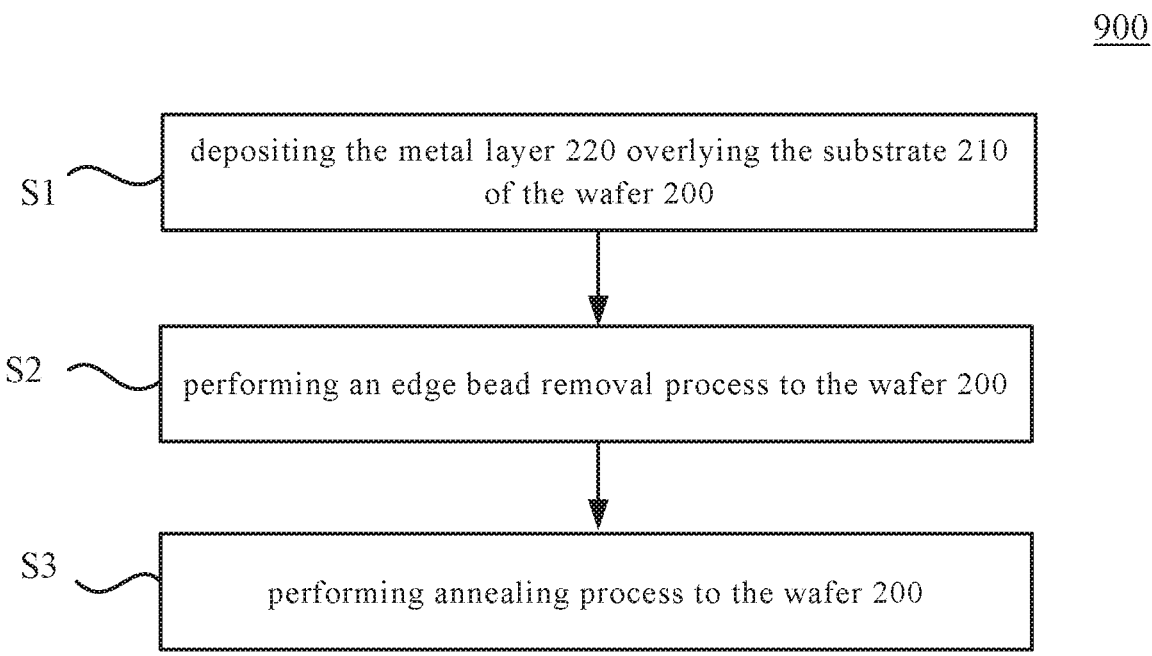
FIG. 2 is a flowchart diagram of a semiconductor manufacturing method in accordance with some embodiments of the present disclosure.

For better understanding of the present disclosure, the operations of the annealing apparatus 100 and the annealing processing of the wafer 200 will be discussed in accompanying with FIG. 2. FIG. 2 is a flowchart diagram of a semiconductor manufacturing method 900 in accordance with some embodiments of the present disclosure. It is noted that, the semiconductor manufacturing method 900 in FIG. 2 will be explained in accompanying with FIG. 1, but the present disclosure is not limited thereto. In various embodiments, the semiconductor manufacturing method 900 may also be applied in various annealing devices.

Figure 3A:
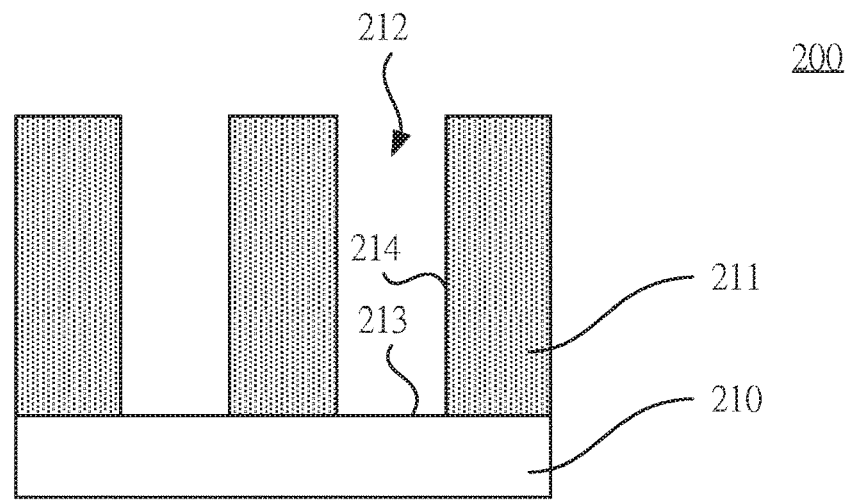
FIG. 3A-FIG. 3C are diagrams illustrating the manufacturing process of the wafer in accordance with some embodiments of the present disclosure.
Figure 3B:
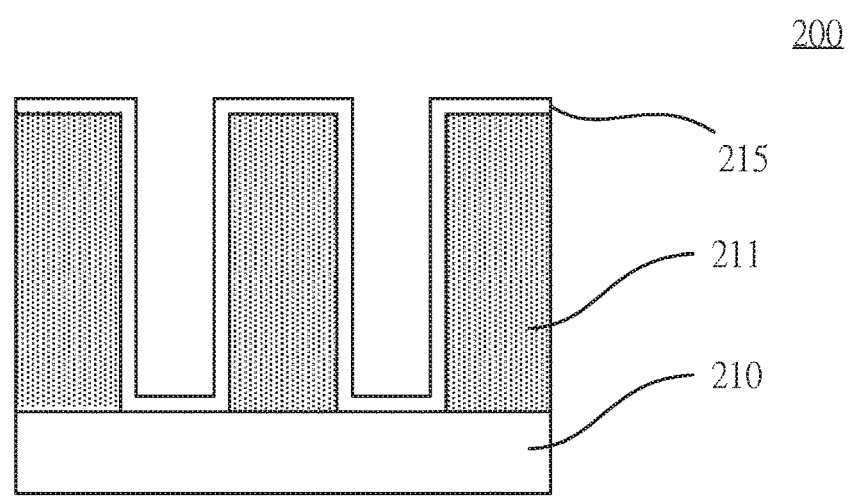
Figure 3C:
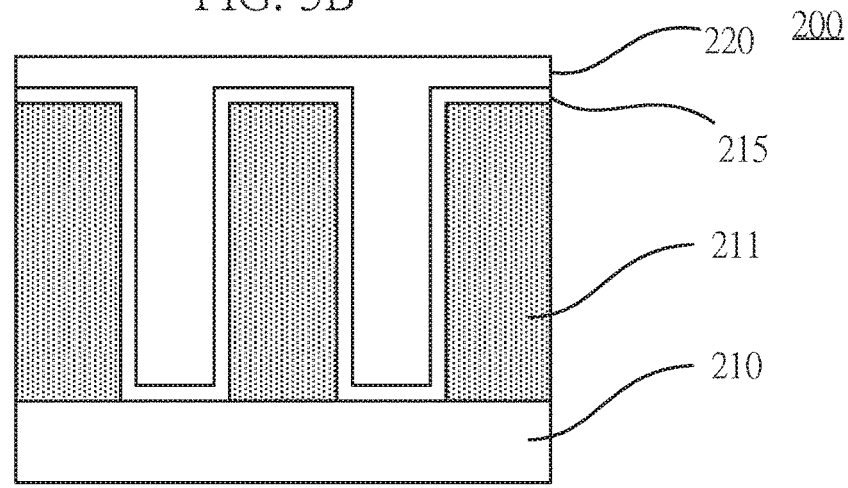

As shown in FIG. 2, the semiconductor manufacturing method 900 includes operations S1, S2, and S3. In operation S1, the metal layer 220 is deposited overlying the substrate 210 of the wafer 200. Reference is made to FIG. 3A-FIG. 3C. FIG. 3A-FIG. 3C are diagrams illustrating the manufacturing process of the wafer 200 in accordance with some embodiments of the present disclosure.

During the manufacturing process, as shown in FIG. 3A, a dielectric layer 211 is formed on the substrate 210. In some embodiments, the substrate 210 refers to any workpiece upon which film processing is performed. Depending on the processing stage, the substrate 210 corresponds to a silicon wafer, or other material layers, which have been formed on the substrate. For example, the dielectric layer 211 is formed over the underlying substrate 210 to form a part of the overall integrated circuit.

In some embodiments, the dielectric layer 211 includes, for example, an oxide, such as silicon dioxide. Once the dielectric layer 211 is deposited, the dielectric layer 211 is, for example, etched to form at least one opening 212 within dielectric layer 211. The opening 212 exposes portions 213 of the underlying substrate 210 and the dielectric sidewalls 214.

In various embodiments, etching of the dielectric layer 211 may be accomplished with any dielectric etching process, including plasma etching. Specific chemical etchants used to etch dielectrics such as silicon dioxide or organic dielectric materials may include such chemical etchants as buffered hydrofluoric acid or acetone. It is noted that, patterning and etching may be accomplished using various methods, and thus the methods mentioned above are merely by examples and not meant to limit the present disclosure.

As shown in FIG. 3B, an optional barrier layer 215 is formed atop the dielectric layer 211 to cover the exposed portions 213 of the underlying substrate 210 and the dielectric sidewalls 214. The barrier layer 215 is deposited to prevent or restrict diffusion from a subsequently deposited metal layer to the substrate 210 and dielectric layer 211. For a metal layer that includes copper, the barrier layer 215 may include such materials as refractory metals (such as tungsten (W), tungsten nitride (WN), niobium (Nb), aluminum silicates, etc.), tantalum (Ta), tantalum nitride (TaN), titanium nitride (TiN), PVD Ti/N2-stuffed, doped silicon, aluminum, and aluminum oxides, a ternary compound (such as TiSiN, WSiN, etc.) or any combinations thereof.

As shown in FIG. 3C, the metal layer 220 is formed atop the optional barrier layer 215. In some embodiments, the metal layer 220 fills the opening 212. In order to fill the opening 212, the field of the structure is covered with the metal. In some embodiments, the metal layer 220 is formed of copper. As mentioned in above paragraphs, in some embodiments, the metal layer 220 is deposited by, for example, ECP process, but the present disclosure is not limited thereto. In some alternative embodiments, physical vapor deposition (PVD) process or chemical vapor deposition (CVD) process may be applied.

Next, in operation S2, an edge bead removal process is performed to the wafer 200. Specifically, during the process of manufacturing a multilayer structure, a planarization process is applied to polish the substrate surface between the individual layer deposition steps, so as to provide a relatively flat surface for the next deposition step. When an ECP process is used as a deposition step, an edge bead generally forms proximate the perimeter of the substrate 210, which inhibits effective planarization processes. Therefore, an edge bead removal (EBR) process is conducted after the ECP deposition process. During the EBR process, unwanted edge beads deposited on the bevel or edge of the substrate 210 during the ECP deposition process are removed. Accordingly, effective planarization of the substrate surface is achieved.

Figure 4:
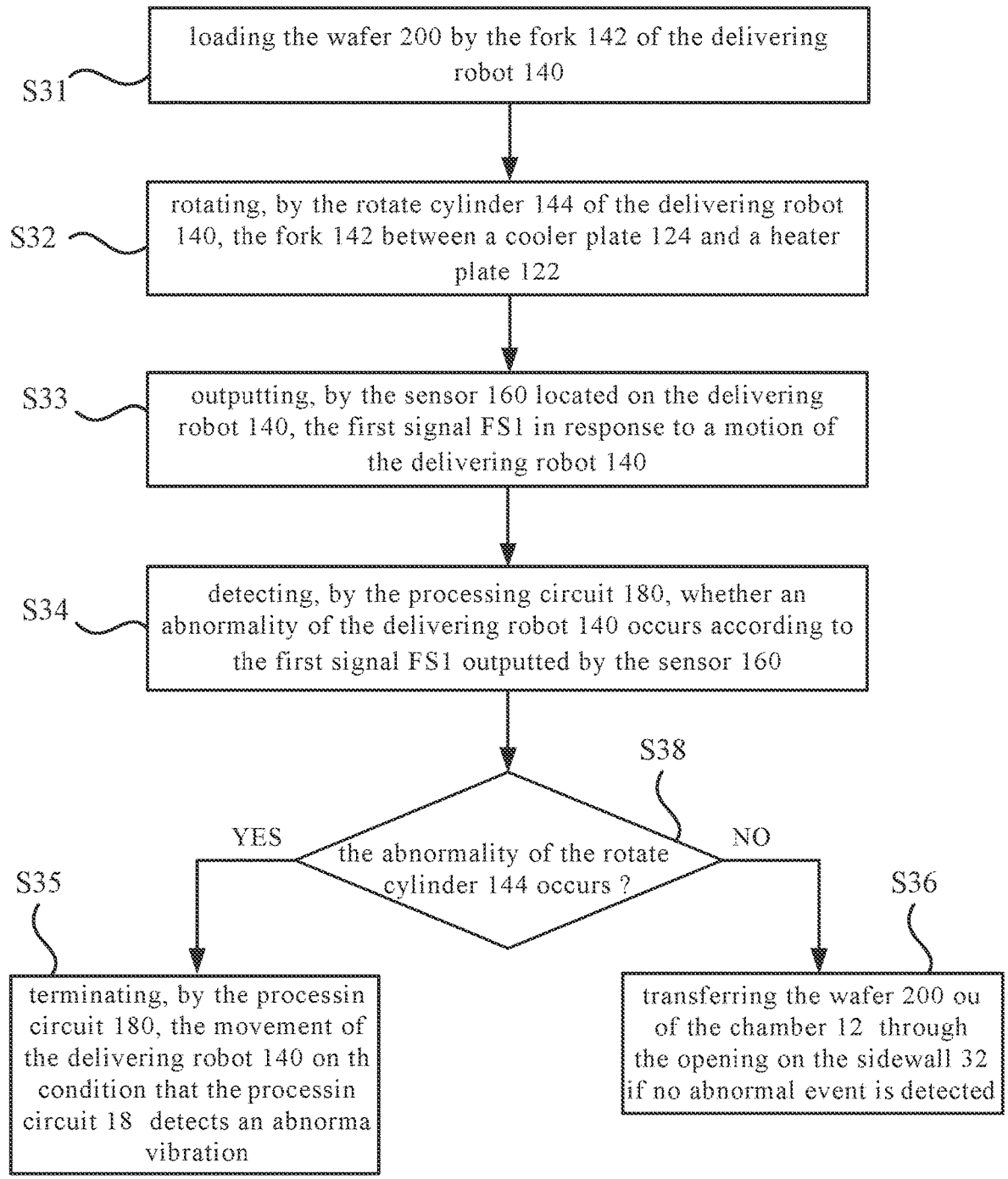
FIG. 4 is a flowchart diagram illustrating detailed operation of the annealing process in accordance with some embodiments of the present disclosure.

Next, in operation S3, an annealing process is performed to the wafer 200. Reference is made to FIG. 4 together. FIG. 4 is a flowchart diagram illustrating detailed operation of the annealing process in the operation S3 in accordance with some embodiments of the present disclosure. As shown in FIG. 4, in some embodiments, the annealing process in the operation S3 includes operation S31, S32, S33, S34, S35, S36, and S38.

In operation S31, the wafer 200 is loaded by the fork 142 of the delivering robot 140. As discussed above, the loading surface of the fork 142 is configured to carry the wafer 200 after the wafer 200 is transferred into the chamber 120.

In operation S32, the rotate cylinder 144 of the delivering robot 140 is configured to rotate the fork 142 between the cooler plate 124 and the heater plate 122. In detail, the rotate cylinder 144 may rotate the fork 142 coupled to the rotate cylinder 144 from the cooler plate 124 to the heater plate 122 to anneal the metal layer 220 on the wafer 200.

For example, in some embodiments, the wafer 200 is heated by the heater 123 under the heater plate 122 to about 600° C. to about 1200° C. In some embodiments, the wafer 200 is heated to about 700° C. to about 1150° C. In some embodiments, the wafer 200 is heated to about 800° C. to about 1000° C. Sustainable thermal annealing process for about 1 second to about 120 seconds. In some embodiments, the annealing process is from about 2 seconds to about 60 seconds. In some other embodiments, the annealing process is from about 5 seconds to about 30 seconds. In some embodiments, the atmosphere of the process chamber 120 contains at least one anneal gas, such as nitrogen, hydrogen, argon, helium, nitrogen and hydrogen mixed gas, derivatives thereof, or any combinations thereof. In some embodiments, the pressure in the processing chamber 120 is from about 5 Torr to about 100 Torr, for example about 10 Torr. It is noted that the value mentioned above in merely by example and not meant to limit the present disclosure.

After the metal layer 220 on the wafer 200 is annealed by the heater 123, the rotate cylinder 144 may rotate the fork 142 from the heater plate 122 to the cooler plate 124 to cool the wafer 200. In other words, the wafer 200 is subject to a cooling step after the annealing step is completed.

At the start of the cooling step, the chamber pressure is preferably in a range that enables a high rate of cooling. On the condition that the pressure in the chamber 120 is too high once cooling begins, heat transfer is likely to be impeded by the reduced mean free path between molecules of process gas. On the condition that the pressure is too low, heat transfer will also likely be sub-optimal. For example, in some embodiments, the pressure is in a range of about 100 Torr to about 150 Torr when the cooling step is initiated and throughout the duration of the cooling step. Initially, the wafer 200 is brought into the proximity of the cooler plate 124 by the fork 142 to facilitate the cooling of the wafer 200 and metal layer 220 thereon. In some embodiments, the cooling of the wafer 200 and metal layer 220 formed thereon takes place rapidly. The temperature of the wafer 200 and metal layer 220 formed thereon is reduced from a temperature in the range of about 80 Celsius to about 400 Celsius to a temperature in the range of about 50 Celsius to about 100 Celsius in a period of less than about 30 seconds. In some embodiments, the temperature of the wafer 200 and metal layer 220 formed thereon is reduced from a temperature in the range of about 80 Celsius to about 400 Celsius to a temperature in the range of about 60 Celsius to about 80 Celsius in a period of less than about 30 seconds. Process gas may continue to be provided to the chamber 120 during the cooling step. In some embodiments, the flow rate of process gas is in the range of about 4 slm to about 6 slm.

Through the annealing and cooling process applied to the metal layer 220, the metal, such as copper, will flow and fill any voids formed in the openings and further manage grain growth and crystal orientation of the metal layer 220 formed on the substrate 210. Furthermore, the annealing and cooling steps, when conducted under the conditions thus specified, provide the metal layer 220 with a highly consistent and predictable microstructure as well as consistent electrical resistivity.

In operation S33, the sensor 160 located on the delivering robot 140 is configured to output the first signal FS1 in response to a motion of the delivering robot 140. In operation S34, the processing circuit 180 is configured to detect whether an abnormality of the delivering robot 140 occurs according to the first signal FS1 outputted by the sensor 160. In some embodiments, the processing circuit 180 is configured to convert the first signal FS1 from a time domain to a frequency domain, and determine whether the abnormality of the delivering robot 140 occurs accordingly. Specifically, the processing circuit 180 is configured to decompose the first signal FS1 in a time series into a spectrum of multiple frequencies. Then, the processing circuit 180 is configured to detect the motion of the delivering robot 140 according to the spectrum of the frequencies.

On the condition that the delivering robot 140 operates normally and the rotate cylinder 144 of the delivering robot 140 rotates the fork 142 between the cooler plate 124 and the heater plate 122 normally, the motion and the vibration of the delivering robot 140 are relatively simple. In some embodiments, a major fluctuation in the waveform of the first signal FS1 indicates the vibration of the delivering robot 140 during the activation or termination of the rotate cylinder 144 and/or the fork 142 of the delivering robot 140, which is controlled by the motor 146 coupled to the rotate cylinder 144 in response to the driving current Id. Ripples of the fluctuation are in the waveform of the first signal FS1 in a relatively symmetric manner.

On the condition that the delivering robot 140 operates abnormally and an improper vibration under wafer placing or shipping when the wafer 200 is loaded by the fork 142, the undesired motion and the vibration of the delivering robot 140 result in a relatively complicated waveform of the first signal FS1 in the time domain. Multiple fluctuations with different amplitudes found in the waveform of the first signal FS1 indicates the wafer implicit vibration, a fork oscillation of up-down and rotation, or an undesired cylinder motion and/or vibration. Alternatively stated, an abnormality of the delivering robot 140 occurs, and ripples of the fluctuation are shown in the waveform of the first signal FS1 in a relatively asymmetric manner.

Therefore, in some embodiments, the processing circuit 180 is configured to calculate energy spectral densities at the multiple frequencies based on the first signal FS1 and then calculate a signal-to-noise-ratio value based on the energy spectral densities. Accordingly, the processing circuit 180 is able to determine an abnormal vibration occurs on the condition that the calculated signal-to-noise-ratio value is greater than a threshold value.

In some embodiments, the conversion between the first signal FS1 in the time domain and in the spectrum domain may be denoted by the time-domain and spectrum-domain energy analysis equation below:

$$S_{xx}(f) = (\Delta t)^2 |\Sigma_{n=-\infty}^{\infty} x_n e^{-2\pi i f n \Delta t}|^2 = \hat{x}_d(f) \hat{x}^*_d(f)$$

where $S_{xx}(f)$ denotes the power spectrum of the time series $x(t)$, $\hat{x}_d(f)$ is the discrete Fourier transform of $x_n$ and $\hat{x}^*_d(f)$ is the complex conjugate of $\hat{x}_d(f)$. The sampling interval $\Delta t$ is needed to keep the correct physical units and to ensure that we recover the continuous case in the limit $\Delta t \rightarrow 0$. Infinite number of values $x_n$ denote the signal sampled at discrete times $x_n = x(n\Delta t)$.

In some embodiments, the energy spectral density under normal operation is controlled under about 60-70 mg, for example, under about 66 mg. On the other hand, in some embodiments, the energy spectral density under abnormal operation is greater than about 110-120 mg, for example, greater than about 114 mg.

In other words, in some embodiments, the processing circuit 180 is configured to store a sample spectrum indicating the normal operation, and compare the spectrum generated based on the received first signal FS1 and the sample spectrum. On the condition that an error value of a difference between the sample spectrum and the spectrum to be analyzed is greater than the predetermined threshold, the processing circuit 180 determines the abnormality of the delivering robot 140 occurs. In some embodiments, the processing circuit 180 performs corresponding protection process on the condition that the abnormality of the delivering robot 140 occurs and being detected.

In operation S38, the processing circuit 180 determines whether the abnormality of the rotate cylinder 144 occurs. The processing circuit 180 performs corresponding protection process on the condition that the abnormality of the rotate cylinder 144 occurs.

For example, in some embodiments, in operation S35, the processing circuit 180 is configured to terminate the movement of the delivering robot 140 on the condition that the processing circuit 180 detects an abnormal vibration. Accordingly, the manufacturing process is halted until the abnormal issue is cleared. Thus, if the wafer 200 is scratched or damaged in the transportation during the annealing and cooling process, the abnormal issue is found in an early stage.

On the other hand, in operation S36, if no abnormal event is detected, the wafer 200 is transferred out of the chamber 120, and transported by the loading station transfer robot in order to perform the following manufacturing process.

Figure 5:
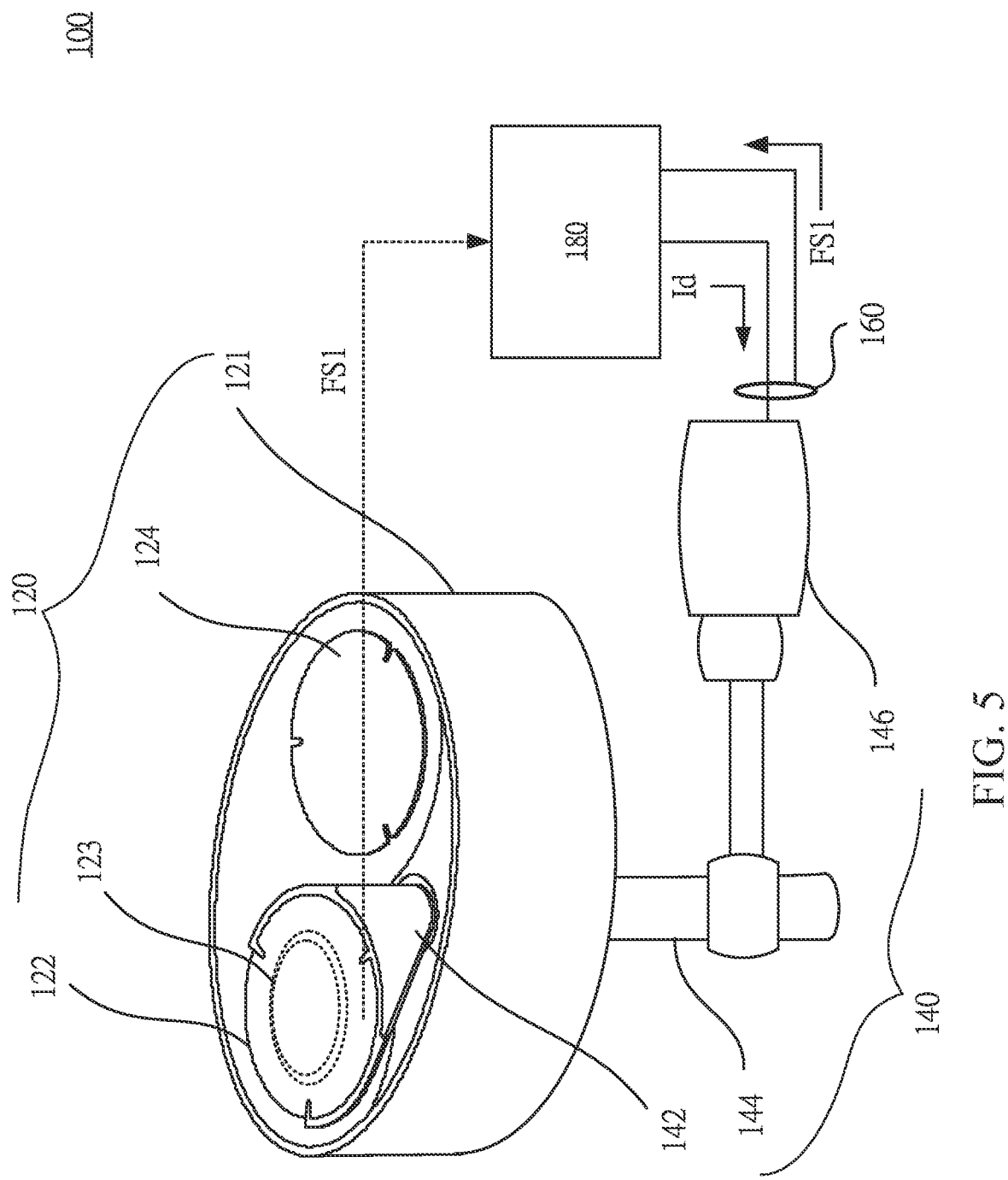
FIG. 5 is a diagram illustrating the annealing apparatus 100 in accordance with some other embodiments of the present disclosure.

Reference is made to FIG. 5. FIG. 5 is a diagram illustrating the annealing apparatus 100 in accordance with some other embodiments of the present disclosure. As shown in FIG. 5, compared to the annealing apparatus 100 depicted in FIG. 1, for the annealing apparatus 100 in FIG. 5, the sensor 160 is coupled to the motor 146. In some embodiments, the sensor 160 is implemented by a current sensor which is used to detect the driving current Id. For example, the current sensor may be realized by Hall Effect sensors, which applies the Hall Effect to achieve the current detection to the driving current Id.

Accordingly, the processing circuit 180 is configured to calculate a torque of the motor 146 based on the driving current Id detected by the current sensor. The torque of a DC motor 146 may be denoted by the following equation:

$$T = C_t \emptyset I_a$$

where T denotes the DC motor torque, $C_t$ denotes the torque constant, $\emptyset$ denotes the main pole flux and $I_a$ denotes the armature current which may be obtained by the sensor 160. According to the Newton's second law of motion, the shift s may be represented as follows:

$$s = \int \frac{C_t \emptyset I_a}{m}$$

where m is mass load. Since the vibration signal is represented in units of the acceleration, the equations mentioned above and the Newton's second law of motion may be applied by the processing circuit 180 to perform the conversion between the torque of the motor 146 and the acceleration movement of the delivering robot 140. Thus, the processing circuit 180 may determine whether the abnormal vibration occurs based on the sensed driving current Id and the changes of the driving current Id. For example, in some embodiments, the processing circuit 180 is configured to identify an abnormal vibration occurs if the driving current Id varies dynamically in a short time period.

Figure 6C:
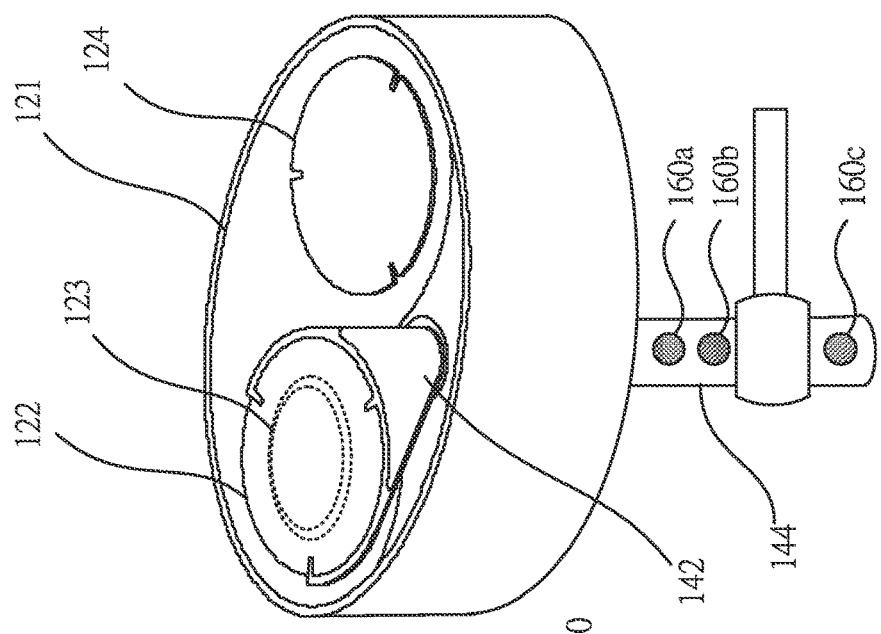
FIG. 6A, FIG. 6B and FIG. 6C are diagrams illustrating arrangement of the sensors 160 in accordance with various embodiments of the present disclosure.
Figure 6B:
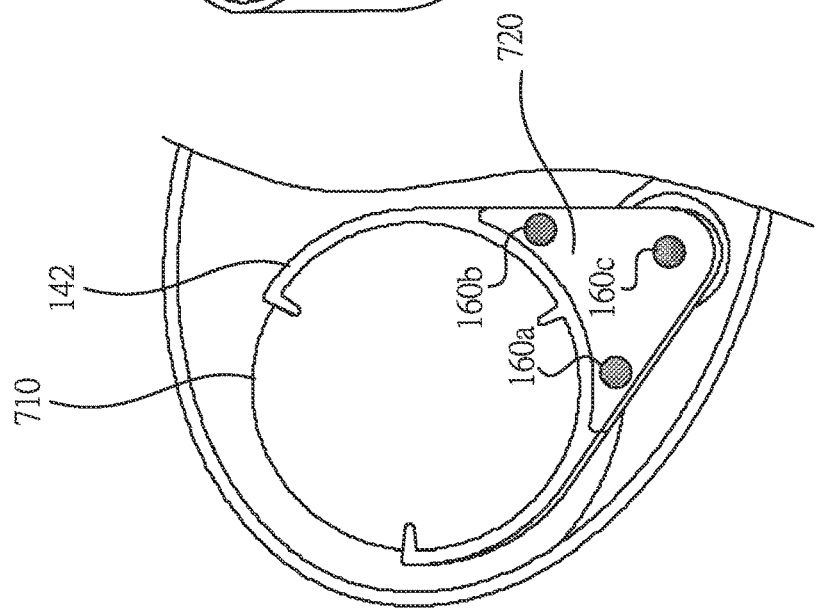
Figure 6A:
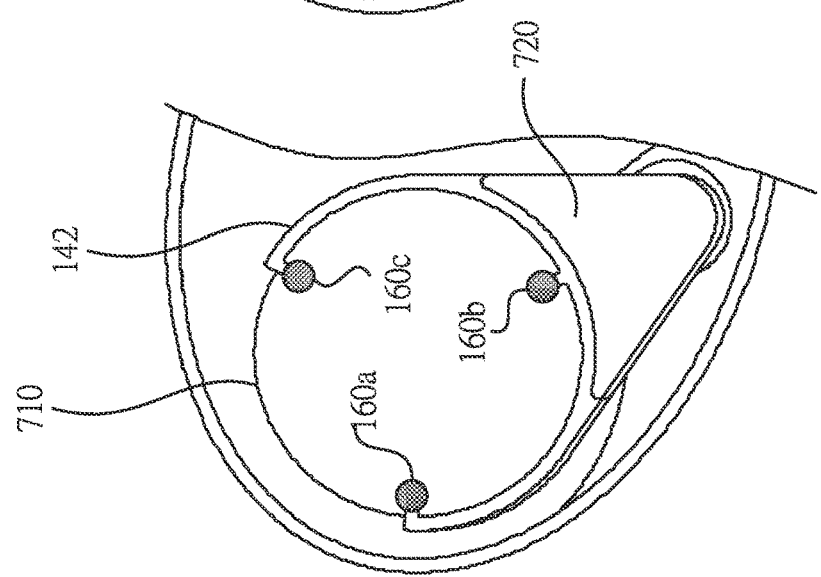

Reference is made to FIG. 6A, FIG. 6B and FIG. 6C. FIG. 6A, FIG. 6B and FIG. 6C are diagrams illustrating arrangement of the sensors 160 in accordance with various embodiments of the present disclosure. As depicted in FIG. 6A, in some embodiments, multiple sensors 160a, 160b, and 160c are located on the loading surface 710 of the fork 142 and configured to output first signals FS1a, FS1b, and FS1c, as discussed above with respect to the signal FS1 illustrated in FIG. 1. As depicted in FIG. 6B, in some embodiments, multiple sensors 160a, 160b, and 160c are located on the support arm 720 of the fork 142 and configured to output the first signals FS1a, FS1b, and FS1c. As depicted in FIG. 6C, in some embodiments, multiple sensors 160a, 160b, and 160c are located on the rotate cylinder 144 coupled to the fork 142, and configured to output the first signals FS1a, FS1b, and FS1c in response to the motion of the rotate cylinder 144.

Accordingly, in some embodiments, multiple sensors 160a, 160b, and 160c may be arranged on the delivering robot 140. It is noted that the arrangement illustrated in FIG. 6A, FIG. 6B and FIG. 6C are merely examples and not meant to limit the present disclosure. Various modifications to the arrangements of the sensors 160a, 160b, and 160c are possible. For example, in some embodiments, the sensors 160a, 160b, and 160c may be located on any possible locations on the fork 142. In some other embodiments, one of the sensors 160a, 160b, and 160c may be located on the loading surface 710 of the fork 142 and the rest of the sensors 160a, 160b, and 160c may be located on the support arm 720 of the fork 142.

If the collision occurs, overall vibration is detected by one or more sensors of the multiple sensors 160a, 160b, and 160c, and the sensors 160a, 160b, and 160c respectively generate and output the first signals FS1a, FS1b, FS1c in response to the motion of the delivering robot 140. In some embodiments, the processing circuit 180 is configured to set an upper limit and/or a lower limit to the first signals FS1a, FS1b, FS1c from multiple sensors 160a, 160b, and 160c to detect and alarm the abnormal events. In some embodiments, the upper limits and/or the lower limits for the first signals FS1a, FS1b, FS1c are the same. In some other embodiments, the upper limits and/or the lower limits for the first signals FS1a, FS1b, FS1c are set differently based on the locations or arrangements of the sensors 160a, 160b, and 160c.

In some embodiments, the processing circuit 180 determines the abnormal events occurs if any one of the first signals FS1a, FS1b, FS1c reaches the predetermined limits or threshold, but the present disclosure is not limited thereto. For example, in some other embodiments, the processing circuit 180 determines the abnormal events occurs if the number of the first signals FS1a, FS1b, FS1c indicating abnormal vibration reaches a target amount. In some other embodiments, the processing circuit 180 is configured to weight for the first signals FS1a, FS1b, FS1c by corresponding weights, sum up the weighted value and determine whether the abnormal events occurs based on the sum of the weighted first signals FS1a, FS1b, FS1c.

Similarly, if the collision occurs, overall vibration is detected by one or more sensors of the multiple sensors 160a, 160b, and 160c, and the sensors 160a, 160b, and 160c respectively generate and output the first signals FS1a, FS1b, FS1c in response to the motion of the delivering robot 140. In some embodiments, the processing circuit 180 is configured to set an upper limit and/or a lower limit to the first signals FS1a, FS1b, FS1c from multiple sensors 160a, 160b, and 160c to detect and alarm the abnormal events. In some embodiments, the upper limits and/or the lower limits for the first signals FS1a, FS1b, FS1c are the same. In some other embodiments, the upper limits and/or the lower limits for the first signals FS1a, FS1b, FS1c are set differently based on the locations or arrangements of the sensors 160a, 160b, and 160c.

As described above, in various embodiments, by the arrangements of the one or more sensors, one or more characteristics of the delivering robot 140 during the operation are detected based on the first signal(s) outputted by the sensors. For example, the abnormal collision of the wafer 200, the operating status of the fork 142, the quality of the cylinder 144, or any combination thereof. Thus, the processing circuit 180 is able to detect whether the wafer 200 is transferred properly in the chamber 120, or any dynamic jittering, shaking, and/or collision occurred with the abnormal acceleration movement. Therefore, the broken or damage of the wafer 200 resulted from the up-down movement or the rotation movement of the fork 142 during the process is detected in an early stage of the manufacturing process.

In some embodiments, an annealing apparatus is disclosed that includes a heater plate and a cooler plate disposed in a chamber, a delivering robot, a sensor and circuitry. The delivering robot is configured to deliver a wafer between the heater plate and the cooler plate in the chamber. The sensor is located on the delivering robot and configured to output a first signal in response to a motion of the delivering robot. The circuitry is coupled to the sensor and the delivering robot, and configured to detect whether an abnormality of the delivering robot occurs according to the first signal and perform a protection process on the condition that the abnormality of the delivering robot occurs.

In some embodiments, also disclosed is an annealing apparatus that includes a fork, a rotate cylinder, a motor, a sensor and circuitry. The fork is arranged in a chamber and configured to load a wafer. The rotate cylinder is coupled to the fork. The motor is coupled to the rotate cylinder and configured to control the rotate cylinder to rotate in response to a driving current, to shift the fork between a heater plate and a cooler plate in the chamber. The sensor is configured to output a first signal in response to the driving current. The circuitry is coupled to the sensor and the motor, and configured to detect whether an abnormality of the rotate cylinder occurs according to the first signal, and perform a protection process on the condition that the abnormality of the rotate cylinder occurs.

In some embodiments, also disclosed is a method, including: loading a wafer, by a fork of a delivering robot; rotating, by a rotate cylinder of a delivering robot, the fork between a cooler plate and a heater plate; outputting, by a sensor located on the delivering robot, a first signal in response to a motion of the delivering robot; detecting, by circuitry, whether an abnormality of the delivering robot occurs according to the first signal; and performing, by the circuitry, a protection process on the condition that the abnormality of the delivering robot occurs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An annealing apparatus, comprising:
a heater plate and a cooler plate disposed in a chamber;
a delivering robot configured to deliver a wafer between the heater plate and the cooler plate in the chamber;
a gravity sensor located on the delivering robot and configured to output a first signal in response to a motion of the delivering robot; and
circuitry coupled to the gravity sensor and the delivering robot, and configured to detect whether an abnormality of the delivering robot occurs according to the first signal and perform a protection process on the condition that the abnormality of the delivering robot occurs, wherein the circuitry is configured to decompose the first signal in a time series into a spectrum of a plurality of frequencies, and detect the motion of the delivering robot according to the spectrum.

2. The annealing apparatus of claim 1, wherein the delivering robot comprises:
a fork arranged in the chamber and configured to load the wafer; and
a rotate cylinder coupled to the fork and configured to rotate the fork between the heater plate and the cooler plate.

3. The annealing apparatus of claim 2, wherein the gravity sensor is located on a loading surface of the fork, the loading surface is configured to carry the wafer, and the gravity sensor is contacted to the wafer when the wafer is loaded.

4. The annealing apparatus of claim 2, wherein the gravity sensor is located on a support arm of the fork, and the gravity sensor is configured to output the first signal without contacting the wafer when the wafer is loaded.

5. The annealing apparatus of claim 2, further comprising:
a motor coupled to the rotate cylinder and configured to control the rotate cylinder to rotate in response to a driving current.

6. The annealing apparatus of claim 2, wherein the gravity sensor is located on the rotate cylinder and configured to output the first signal in response to the motion of the rotate cylinder.

7. The annealing apparatus of claim 1, wherein the circuitry is further configured to calculate a plurality of energy spectral densities at the plurality of frequencies based on the first signal, and determine an abnormal vibration occurs on the condition that a signal-to-noise-ratio value calculated by the energy spectral densities is greater than a threshold value.

8. The annealing apparatus of claim 1, wherein the circuitry is coupled to the delivering robot, and further configured to terminate a movement of the delivering robot on the condition that the circuitry detects an abnormal vibration.

9. The annealing apparatus of claim 1, further comprising a plurality of gravity sensors located on the delivering robot and configured to output a plurality of first signals in response to the motion of the delivering robot;
wherein the circuitry is further configured to weight the plurality of first signals by corresponding weights, and determine whether the abnormality of the delivering robot occurs according to a sum of the plurality of weighted first signals.

10. The annealing apparatus of claim 1, further comprising an enclosure in the chamber, wherein the heater plate and the cooler plate are disposed in the enclosure.

11. An annealing apparatus, comprising:
a fork arranged in a chamber and configured to load a wafer;
a rotate cylinder coupled to the fork;
a motor coupled to the rotate cylinder and configured to control the rotate cylinder to rotate in response to a driving current, to shift the fork between a heater plate and a cooler plate in the chamber;
a sensor configured to output a first signal in response to the driving current; and
circuitry coupled to the sensor and the motor, and configured to detect whether an abnormality of the rotate cylinder occurs according to the first signal, and perform a protection process on the condition that the abnormality of the rotate cylinder occurs.

12. The annealing apparatus of claim 11, wherein the circuitry is configured to decompose the first signal in a time series into a spectrum of a plurality of frequencies, and detect a motion of the rotate cylinder according to the spectrum.

13. The annealing apparatus of claim 12, wherein the circuitry is configured to calculate a plurality of energy spectral densities at the plurality of frequencies based on the first signal, and determine an abnormal vibration occurs on the condition that a signal-to-noise-ratio value calculated by the energy spectral densities is greater than a threshold value.

14. The annealing apparatus of claim 11, wherein the circuitry is coupled to the motor, and configured to terminate a movement of the rotate cylinder on the condition that the circuitry detects an abnormal vibration.

15. The annealing apparatus of claim 11, wherein the circuitry is configured to calculate a torque of the motor.

16. A method for annealing a wafer, comprising:
   loading the wafer, by a fork of a delivering robot;
   rotating, by a rotate cylinder of the delivering robot, the fork between a cooler plate and a heater plate;
   outputting, by a sensor located on the delivering robot, a first signal in response to a motion of the delivering robot during rotating the fork of the delivering robot between the cooler plate and the heater plate;
   detecting, by circuitry, whether an abnormality of the delivering robot occurs according to the first signal; and
   performing, by the circuitry, a protection process on the condition that the abnormality of the delivering robot occurs.

17. The method of claim 16, wherein rotating the fork comprises:
   rotating, by the rotate cylinder, the fork coupled to the rotate cylinder from the cooler plate to the heater plate to anneal a metal layer on the wafer; and
   rotating, by the rotate cylinder, the fork from the heater plate to the cooler plate to cool the wafer.

18. The method of claim 16, further comprising:
   decomposing, by the circuitry, the first signal in a time series into a spectrum of a plurality of frequencies; and
   detecting, by the circuitry, the motion of the delivering robot according to the spectrum.

19. The method of claim 18, further comprising:
   calculating, by the circuitry, a plurality of energy spectral densities at the plurality of frequencies based on the first signal;
   calculating, by the circuitry, a signal-to-noise-ratio value based on the energy spectral densities; and
   determining, by the circuitry, an abnormal vibration occurs on the condition that the signal-to-noise-ratio value is greater than a threshold value.

20. The method of claim 16, further comprising:
   terminating, by the circuitry, a movement of the delivering robot on the condition that the circuitry detects an abnormal vibration.

\* \* \* \* \*